(12) United States Patent
Rubino

(10) Patent No.: US 11,952,266 B2
(45) Date of Patent: Apr. 9, 2024

(54) MICRO-DEVICE STRUCTURES WITH ETCH HOLES

(71) Applicant: X-Celeprint Limited, Dublin (IE)

(72) Inventor: Pierluigi Rubino, Cork (IE)

(73) Assignee: X-Celeprint Limited, Dublin (IE)

( * ) Notice: Subject to any disclaimer, the term of this patent is extended or adjusted under 35 U.S.C. 154(b) by 376 days.

(21) Appl. No.: 17/066,448

(22) Filed: Oct. 8, 2020

(65) Prior Publication Data

US 2022/0112078 A1    Apr. 14, 2022

(51) Int. Cl.
*B81C 1/00* (2006.01)

(52) U.S. Cl.
CPC ...... *B81C 1/00039* (2013.01); *B81C 1/00523* (2013.01); *B81C 1/00555* (2013.01); *B81C 2201/0105* (2013.01); *B81C 2201/013* (2013.01)

(58) Field of Classification Search
CPC ............ B81C 1/00039; B81C 1/00523; B81C 1/00555; B81C 2201/0105; B81C 2201/013; B81C 1/00476; B81B 2203/0118
See application file for complete search history.

(56) References Cited

U.S. PATENT DOCUMENTS

| | | | |
|---|---|---|---|
| 6,142,358 A | 11/2000 | Cohn et al. | |
| 7,195,733 B2 | 3/2007 | Rogers et al. | |
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 8,039,847 B2 | 10/2011 | Nuzzo et al. | |
| 8,333,860 B1 | 12/2012 | Bibl et al. | |
| 8,470,701 B2 | 6/2013 | Rogers et al. | |
| 8,558,243 B2 | 10/2013 | Bibl et al. | |

(Continued)

OTHER PUBLICATIONS

Bower, C. A. et al., Emissive displays with transfer-printed assemblies of 8 μm×15 μm inorganic light-emitting diodes, Photonics Research, 5(2):A23-A29, (2017).

(Continued)

*Primary Examiner* — Yasser A Abdelaziez
(74) *Attorney, Agent, or Firm* — Choate, Hall & Stewart LLP; Michael D. Schmitt

(57) ABSTRACT

A micro-device structure comprises a source substrate having a sacrificial layer comprising a sacrificial portion adjacent to an anchor portion, a micro-device disposed completely over the sacrificial portion, the micro-device having a top side opposite the sacrificial portion and a bottom side adjacent to the sacrificial portion and comprising an etch hole that extends through the micro-device from the top side to the bottom side, and a tether that physically connects the micro-device to the anchor portion. A micro-device structure comprises a micro-device disposed on a target substrate. Micro-devices can be any one or more of an antenna, a micro-heater, a power device, a MEMs device, and a microfluidic reservoir.

15 Claims, 11 Drawing Sheets

(56) References Cited

U.S. PATENT DOCUMENTS

| | | | |
|---|---|---|---|
| 8,722,458 | B2 | 5/2014 | Rogers et al. |
| 8,791,474 | B1 | 7/2014 | Bibl et al. |
| 8,794,501 | B2 | 8/2014 | Bibl et al. |
| 8,835,940 | B2 | 9/2014 | Hu et al. |
| 8,865,489 | B2 | 10/2014 | Rogers et al. |
| 8,877,648 | B2 | 11/2014 | Bower et al. |
| 8,889,485 | B2 | 11/2014 | Bower |
| 8,934,259 | B2 | 1/2015 | Bower et al. |
| 8,941,215 | B2 | 1/2015 | Hu et al. |
| 8,987,765 | B2 | 3/2015 | Bibl et al. |
| 9,049,797 | B2 | 6/2015 | Menard et al. |
| 9,087,764 | B2 | 7/2015 | Chan et al. |
| 9,105,714 | B2 | 8/2015 | Hu et al. |
| 9,111,464 | B2 | 8/2015 | Bibl et al. |
| 9,139,425 | B2 | 9/2015 | Vestyck |
| 9,153,171 | B2 | 10/2015 | Sakariya et al. |
| 9,161,448 | B2 | 10/2015 | Menard et al. |
| 9,165,989 | B2 | 10/2015 | Bower et al. |
| 9,166,114 | B2 | 10/2015 | Hu et al. |
| 9,178,123 | B2 | 11/2015 | Sakariya et al. |
| 9,217,541 | B2 | 12/2015 | Bathurst et al. |
| 9,240,397 | B2 | 1/2016 | Bibl et al. |
| 9,252,375 | B2 | 2/2016 | Bibl et al. |
| 9,355,854 | B2 | 5/2016 | Meitl et al. |
| 9,358,775 | B2 | 6/2016 | Bower et al. |
| 9,367,094 | B2 | 6/2016 | Bibl et al. |
| 9,412,727 | B2 | 8/2016 | Menard et al. |
| 9,478,583 | B2 | 10/2016 | Hu et al. |
| 9,484,504 | B2 | 11/2016 | Bibl et al. |
| 9,520,537 | B2 | 12/2016 | Bower et al. |
| 9,555,644 | B2 | 1/2017 | Rogers et al. |
| 9,583,533 | B2 | 2/2017 | Hu et al. |
| 9,589,944 | B2 | 3/2017 | Higginson et al. |
| 9,601,356 | B2 | 3/2017 | Bower et al. |
| 9,640,715 | B2 | 5/2017 | Bower et al. |
| 9,716,082 | B2 | 7/2017 | Bower et al. |
| 9,761,754 | B2 | 9/2017 | Bower et al. |
| 9,765,934 | B2 | 9/2017 | Rogers et al. |
| 9,865,832 | B2 | 1/2018 | Bibl et al. |
| 9,929,053 | B2 | 3/2018 | Bower et al. |
| 2002/0086540 | A1* | 7/2002 | Lebouitz ............... B81B 3/0081 438/694 |
| 2003/0141570 | A1 | 7/2003 | Chen et al. |
| 2010/0306993 | A1 | 12/2010 | Mayyas et al. |
| 2013/0277770 | A1* | 10/2013 | Tsai ..................... H01G 5/18 257/415 |
| 2013/0300812 | A1* | 11/2013 | Bibl .................... B81C 99/002 347/159 |
| 2013/0309792 | A1 | 11/2013 | Tischler et al. |
| 2013/0316487 | A1 | 11/2013 | de Graff et al. |
| 2014/0159043 | A1 | 6/2014 | Sakariya et al. |
| 2016/0093600 | A1 | 3/2016 | Bower et al. |
| 2017/0338374 | A1 | 11/2017 | Zou et al. |
| 2017/0358717 | A1* | 12/2017 | Cok ..................... H01L 33/505 |
| 2022/0112073 | A1 | 4/2022 | Trindade et al. |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S et al., AMOLED displays with transfer-printed integrated circuits, Journal of SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Haobing, L. et al., Layout controlled one-step dry etch and release of MEMS using deep RIE on SOI wafer, Journal of Microelectromechanical Systems, 15(3):541-547 (2006).

* cited by examiner

MICRO-DEVICE STRUCTURES WITH ETCH HOLES

CROSS REFERENCE TO RELATED APPLICATIONS

The present disclosure is related to U.S. patent application Ser. No. 17/006,498, entitled Non-Linear Tethers for Suspended Devices by Trindade et al., filed Aug. 26, 2020, the disclosure of which is incorporated by reference herein in its entirety.

TECHNICAL FIELD

The present disclosure generally relates to micro-transfer printed devices and structures that enable device release from a source wafer.

BACKGROUND

Components can be transferred from a source wafer to a target substrate using micro-transfer printing. Methods for transferring small, active components from one substrate to another are described in U.S. Pat. Nos. 7,943,491, 8,039,847, and 7,622,367. In these approaches, small integrated circuits are formed on a native semiconductor source wafer. The small, unpackaged integrated circuits, or chiplets, are released from the native source wafer by pattern-wise etching sacrificial portions of a sacrificial layer located beneath the chiplets, leaving each chiplet suspended over an etched sacrificial portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a target substrate or backplane.

Crystalline source wafers can etch anisotropically so that the etch proceeds more rapidly in one direction than in another direction with respect to the crystal planes in the source wafer. Thus, a sacrificial portion of the source wafer can etch more rapidly in one direction than another so that a micro-device or tether disposed over the sacrificial portion is only partially undercut and are partially unetched. Despite the difference in etch rates in different directions in a crystalline source wafer, micro-devices, tethers, and anchor portions can still be attacked by the etchant, especially if the etch takes a substantial amount of time, compromising the integrity of the micro-device, tether, and the anchor portion and possibly leading to failures in micro-device pickup from the source wafer with the stamp and failures in micro-device performance on the target substrate. Furthermore, slow etch rates can reduce manufacturing throughput and, because the etch chemistry selectivity amongst materials is not infinite, the encapsulating layers should be exposed as little as possible to the wet etch chemistry as they also etch away (albeit at much slower rates).

There is a need, therefore, for micro-device and source wafer structures and methods that facilitate micro-device release from a source wafer in less time and with reduced etching damage to micro-devices and transfer structures.

SUMMARY

The present disclosure provides, inter alia, structures and methods for improving the release of micro-devices from a source substrate to enable micro-transfer printing the micro-devices from the source substrate to a target substrate. According to some embodiments, a micro-device structure comprises a source substrate having a sacrificial layer comprising a sacrificial portion adjacent to an anchor portion and a micro-device disposed completely over the sacrificial portion. The sacrificial portion can be the substrate itself or a gap formed by etching a sacrificial portion of material, for example. The micro-device can have a top side opposite the sacrificial portion and a bottom side adjacent to the sacrificial portion and the micro-device can comprise an etch hole that extends through the micro-device from the top side to the bottom side. A tether can physically connect the micro-device to the anchor portion. According to some embodiments, the etch hole is in contact with the sacrificial portion and exposes at least a portion of the sacrificial portion, the etch hole is not at a geometric center of the micro-device, the etch hole is at the geometric center of the micro-device, the etch hole is rectangular, the etch hole has a portion of a perimeter that is at the geometric center, or any compatible combination of these.

According to embodiments of the present disclosure, the sacrificial portion of the source substrate has a crystalline structure that is anisotropically etchable, the source substrate is made of silicon {100}, the source substrate has a crystalline structure with a {100} orientation (such that a {100} crystal plane is exposed at a surface of the source substrate) and the bottom side of micro-device is substantially parallel to the source substrate surface and to a {100} crystal plane on the surface, or any combination of these. According to some embodiments, the micro-device has a micro-device edge direction oriented at an angle from 0 to 90 degrees, and in some embodiments 30 to 60 degrees, with respect to the {110} crystal plane. The micro-device can have a micro-device edge direction oriented at an angle of substantially (e.g., within manufacturing tolerances) 45 degrees with respect to the {110} crystal plane. The source substrate can have a crystalline structure with a {100} crystal plane, the micro-device can have a micro-device width and the direction of the micro-device width can be substantially (e.g., within manufacturing tolerances) parallel to the {100} crystal plane and oriented from 0 to 90 degrees and more specifically 30 to 60 degrees, such as 45 degrees, with respect to a {110} crystal plane. The etch-hole width can be measured in a direction parallel to the tether width and can be longer than the etch-hole length.

According to some embodiments, the etch hole is rectangular and has an etch-hole width, the tether has a tether width connecting the micro-device to the anchor portion, and the etch-hole width is no less than the tether width. That is, the extent of the connection between the micro-device and the tether (or the anchor portion and the tether) in a direction is equal to or smaller than the extent of the etch hole in the same direction, e.g., in a direction parallel to the connection between the micro-device and the tether or to the connection between the anchor portion and the tether. In some embodiments, the etch-hole width is greater than the tether width. The etch hole and the micro-device can both be rectangular. The etch hole can have an etch-hole edge, the micro-device can have a micro-device edge, and the etch-hole edge can be substantially parallel to the micro-device edge. The etch hole can have an etch-hole edge with an etch-hole width in the range of 5 microns to 20 microns. The micro-device can have a micro-device length no greater than 5 mm, 2 mm, 1 mm, 500 microns, 200 microns, 150 microns, or 100 microns.

According to some embodiments, the tether physically connects the anchor portion directly to a corner of the micro-device. According to some embodiments, a micro-device structure comprises micro-devices, each micro-device disposed completely over a corresponding sacrificial portion in a direction orthogonal to the source substrate surface and physically connected by a respective tether to the anchor portion, wherein each of the micro-devices and the respective tether are rotated with respect to any other of the micro-devices and the respective tether. The anchor portion can have a surface that is a square or circle. The anchor portion can substantially be a cube or cylinder, or an equivalent structure.

According to embodiments of the present disclosure, a micro-device structure comprises a target substrate, a micro-device disposed on or over the target substrate, the micro-device having a top side and a bottom side opposite the top side and adjacent to the target substrate, and comprising an etch hole that extends through the micro-device from the top side to the bottom side, and at least a portion of a fractured, broken, or separated tether physically connected to the micro-device. The etch hole can have an etch-hole edge with an etch-hole width in the range of 5 microns to 20 microns. The micro-device can have a micro-device length no greater than 5 mm, 2 mm, 1 mm, 500 microns, 200 microns, 150 microns, or 100 microns.

According to some embodiments of the present disclosure, a micro-device structure comprises a source substrate having a sacrificial layer comprising one or more sacrificial portions each adjacent to an anchor portion, micro-devices, each disposed completely over one of the one or more sacrificial portions, and a respective tether for each of the micro-devices. Each of the micro-devices is physically connected to the anchor portion by the respective tether. In some embodiments, each of the micro-devices and the respective physically connected tether are rotated or reflected, or both reflected and rotated, with respect to each other of the micro-devices and the respective physically connected tether. In some embodiments, the respective tether for each of the micro-devices physically connects the anchor portion directly to a different corner of the micro-device or to a portion of the micro-device closer to the corner than to a center or opposite corner along an edge of the micro-device.

According to some embodiments of the present disclosure, the micro-device is, comprises, or provides one or more of an antenna, a micro-heater, a power device, a MEMs device, and a micro-fluidic reservoir.

According to some embodiments of the present disclosure, a method of making a micro-device structure comprises providing a source substrate comprising a sacrificial layer (e.g., a portion or layer of the source substrate) comprising or providing a sacrificial portion adjacent to an anchor portion, providing a micro-device disposed completely over the sacrificial portion, the micro-device having a top side opposite the sacrificial layer and a bottom side adjacent to the sacrificial layer and comprising an etch hole that extends through the micro-device from the top side to the bottom side and a tether that physically connects the micro-device to the anchor portion, wherein the etch hole exposes a portion of the sacrificial portion, providing an etchant, and etching the sacrificial portion, wherein at least the exposed portion of the sacrificial portion is etched by the etchant passing through the etch hole, thereby forming a gap between the micro-device and the source substrate such that the micro-device is suspended from the anchor portion by the tether.

Methods of the present disclosure can comprise providing a stamp and a target substrate, contacting the micro-device with the stamp to adhere the micro-device to the stamp, removing the stamp from the source substrate, thereby breaking (e.g., fracturing) or separating the tether, pressing the micro-device to a target substrate to adhere the micro-device to the target substrate, and removing the stamp. The etchant can be TMAH or KOH.

According to some embodiments of the present disclosure, an intermediate structure wafer comprises a source substrate having a sacrificial layer comprising a sacrificial portion adjacent to an anchor portion and an intermediate substrate disposed completely over the sacrificial portion. The intermediate substrate has a top side opposite the sacrificial portion and a bottom side adjacent to the sacrificial portion and comprises an etch hole that extends through the intermediate substrate from the top side to the bottom side. One or more micro-devices are disposed on the intermediate substrate (e.g., the top side of the intermediate substrate). The one or more micro-devices are non-native to the intermediate substrate. A tether physically connects the intermediate substrate to the anchor portion.

In some embodiments, one of the one or more micro-devices comprises a micro-device comprising a micro-device etch hole aligned with the etch hole in the intermediate substrate.

In some embodiments, the one or more micro-devices is a plurality of micro-devices that are electrically, optically, or both electrically and optically interconnected.

Structures and methods described herein enable an efficient, effective, and fast release of a micro-transfer printable device or component from a source substrate (e.g., a native source wafer on or in which the device is disposed or formed) with reduced etching damage.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
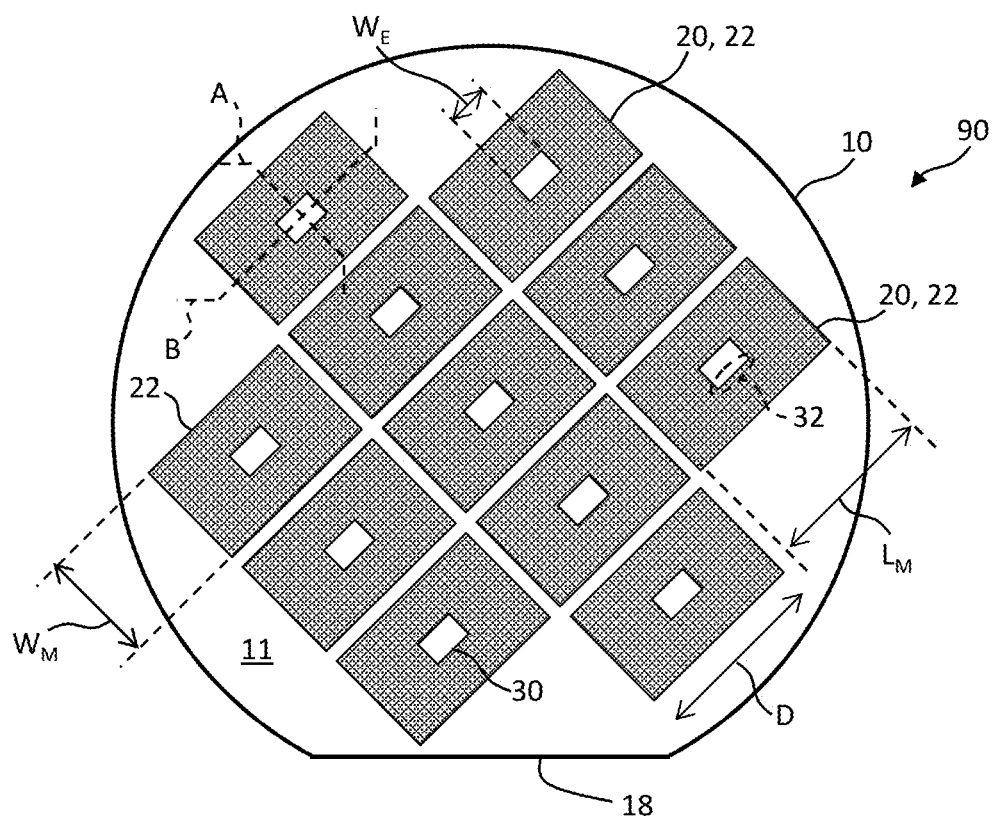
FIG. 1A is a schematic plan view of a source wafer according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, micro-device and source substrate (wafer) structures and methods that facilitate micro-device release from a source substrate in less time and with reduced etching damage to micro-devices and to tethering and anchor structures of the micro-device and source substrate, thereby facilitating the efficient construction, release, and micro-transfer printing of functional micro-devices from a source substrate. A source substrate can be a source wafer.

Figure 1B:
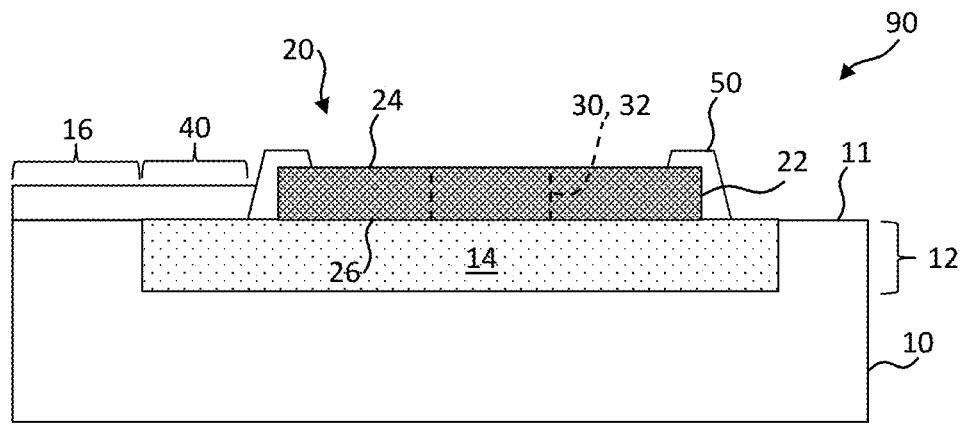
FIG. 1B is a schematic detail cross section of a micro-device on the source wafer taken across cross-section line A of FIG. 1A according to illustrative embodiments of the present disclosure.
Figure 1C:
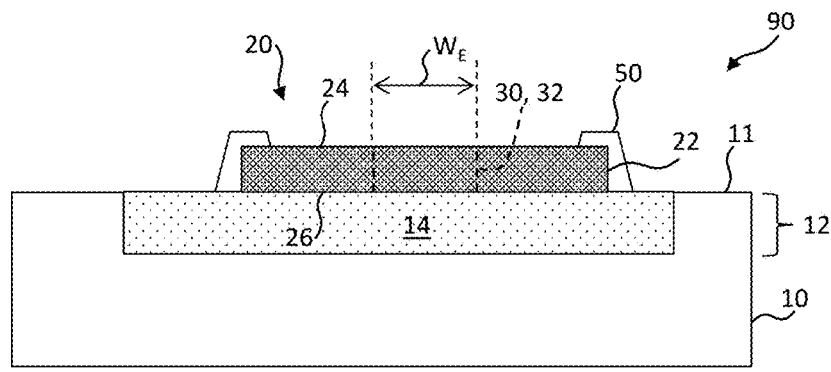
FIG. 1C is a schematic detail cross section of a micro-device on the source wafer taken across cross-section line B of FIG. 1A according to illustrative embodiments of the present disclosure.
Figure 1D:
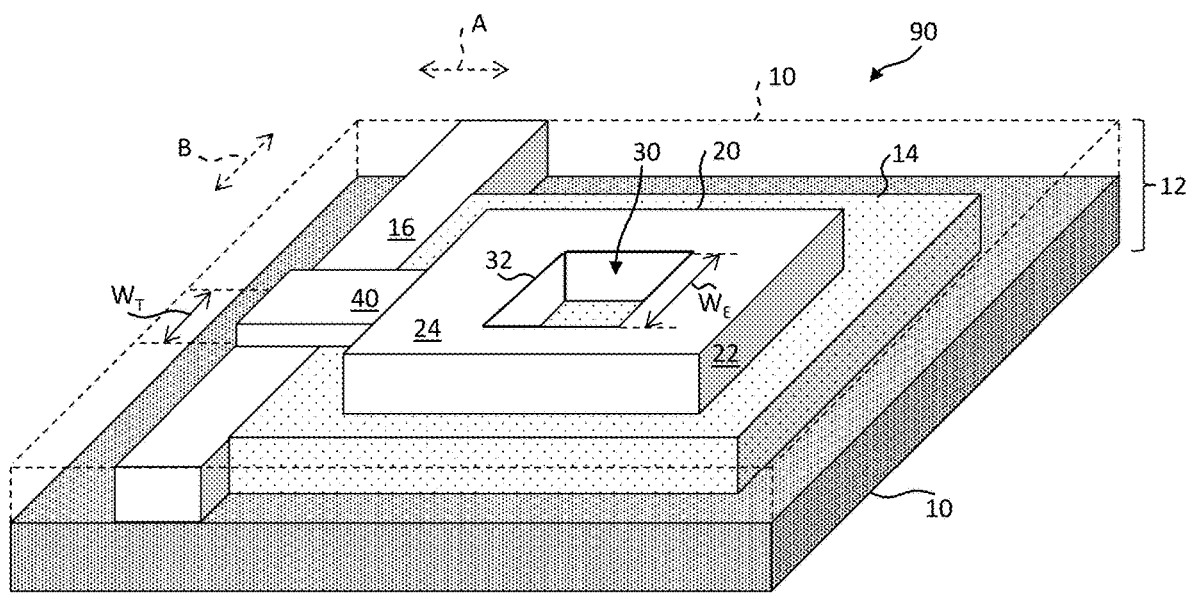
FIG. 1D is a schematic detail cut-away perspective of a micro-device on the source wafer corresponding to FIGS. 1A-1C according to illustrative embodiments of the present disclosure.
Figure 1E:
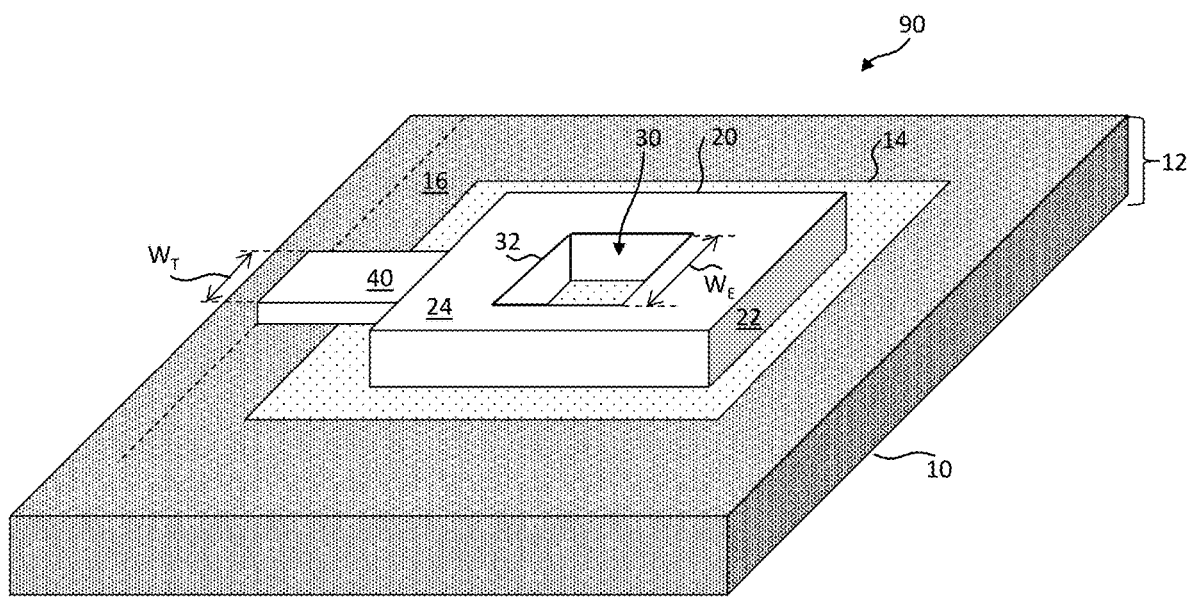
FIG. 1E is a detail perspective of a micro-device on the source wafer corresponding to FIGS. 1A-1C according to illustrative embodiments of the present disclosure.

According to some embodiments of the present disclosure and as shown in the plan view of FIG. 1A, the detail cross section of FIG. 1B taken across cross section line A of FIG. 1A, the detail cross section of FIG. 1C taken across cross section line B of FIG. 1A, and the detail perspectives of FIGS. 1D and 1E corresponding to FIG. 1A, a micro-device structure 90 comprises a source substrate 10 (e.g., a source wafer) having a sacrificial layer 12 comprising a sacrificial portion 14 adjacent to an anchor portion 16. A micro-device 20 is disposed completely over sacrificial portion 14. Micro-device 20 has a top side 24 opposite sacrificial layer 12 and sacrificial portion 14 adjacent to and a bottom side 26 adjacent to sacrificial layer 12 and sacrificial portion 14. An etch hole 30 extends through micro-device 20 from top side 24 to bottom side 26 and exposes and contacts sacrificial portion 14, providing access to sacrificial portion 14 through etch hole 30 by an etchant. Etch hole 30 has an etch-hole width $W_E$. A tether 40 having a tether width $W_T$ physically connects micro-device 20 to anchor portion 16. Tether width $W_T$ and etch-hole width $W_E$ can be parallel to each other and can be in a direction parallel to an edge of anchor portion 16 adjacent to micro-device 20 or an edge of micro-device 20 adjacent to anchor portion 16 where tether 40 connects micro-device 20 to anchor portion 16 and parallel to source substrate surface 11, as shown in FIGS. 1C and 1D. As illustrated for example in FIG. 1A, edge-hole width $W_E$ can be greater than a length of edge hole 30 in a direction orthogonal to edge-hole width $W_E$ and edge-hole width $W_E$ can be in a direction parallel to a length $L_M$ of micro-device 20. Source substrate 10 has a source substrate surface 11 and a flat edge (source substrate flat 18) used to orient and position source substrate 10 for photolithographic processing, as is typical in the photolithographic arts. Source substrate flat 18 is usually specified and oriented with respect to the crystallographic structure of source substrate 10. In some embodiments, a location, orientation, or size of source substrate flat 18 indicates a doping characteristic of source substrate 10, for example p-type or n-type doping. Micro-device 20 has one or more micro-device edges 22. In some embodiments, micro-device 20 is rectangular and a micro-device edge 22 extends in a direction D parallel to source substrate surface 11 and at substantially 45 degrees to source substrate flat 18 (e.g., within manufacturing tolerances). In perspective cut-away FIG. 1D, source substrate 10 surrounds sacrificial portion 14 in a common plane, as indicated with dashed lines. FIG. 1E illustrates source substrate 10 extending to the common plane on which is disposed micro-device 20.

Etch hole 30 can be, but is not necessarily, centered at or aligns with (e.g., an edge of etch hole 30 aligns with) a geometric center of micro-device 20. Etch hole 30 can be, but is not necessarily, rectangular (e.g., square), and can have an etch-hole width $W_E$ (e.g., any extent) parallel to source substrate surface 11. Micro-device 20 can be protected by patterned dielectric structure(s) 50. Dielectric structure(s) 50 can be a part of micro-device 20 (e.g., an encapsulation layer), or a separate structure.

According to some embodiments of the present disclosure, source substrate 10 has a crystalline structure that is anisotropically etchable. For example, source substrate 10 can be a semiconductor or compound semiconductor substrate or have a semiconductor or compound semiconductor sacrificial layer 12 disposed on a substrate. In some embodiments, source substrate 10 is a silicon substrate, e.g., comprising monocrystalline silicon, such as silicon {100} or silicon {111}. Micro-device 20 can be constructed in an epitaxial layer of source substrate 10 using conventional photolithographic methods and materials. According to some embodiments and as shown in FIG. 1A, source substrate 10 has a crystalline structure with a {100} orientation (parallel to source substrate surface 11) and bottom side 26 (a bottom surface) of micro-device 20 is substantially parallel (e.g., within manufacturing tolerance) to source substrate surface 11 and the {100} crystal plane of source substrate 10. Likewise, ignoring any topographical structure formed by photolithographic processing of micro-device 20, top side 24 (a top surface) of micro-device 20 can be substantially parallel (e.g., within manufacturing tolerances) to bottom side 26, source substrate surface 11, and the {100} crystal plane of source substrate 10. Source substrate 10 has a source substrate flat 18 (e.g., a wafer flat that provides a specified orientation and alignment for source substrate 10) that aligns with the {110} crystal plane of source substrate 10. According to some embodiments, micro-device edge 22 direction D is oriented at an angle from 0 to 90 degrees and more specifically 30 to 60 degrees with respect to the {110} crystal plane, for example substantially at 45 degrees. Thus, assuming that source substrate surface 11 is in an x and y plane and that a z axis is perpendicular to source substrate surface 11 and the x and y planes, micro-device 20 can generally be rotated about the z axis with respect to source substrate flat 18 and {110} crystal planes and, in some embodiments has a particular rotation relative to the z axis to have an edge at substantially 45 degrees to a {110} crystal plane. According to some embodiments, micro-device 20 has a micro-device length $L_M$ greater than a micro-device width $W_M$ and the direction of micro-device length $L_M$ is substantially parallel to the {100} crystal plane and can be oriented at an angle from 0 to 90 degrees with respect to the {110} crystal plane, for example substantially 45 degrees, e.g., in direction D. In some embodiments, micro-device 20 is rectangular. In some embodiments, micro-device 20 is square or has a non-rectangular shape.

Figure 2A:
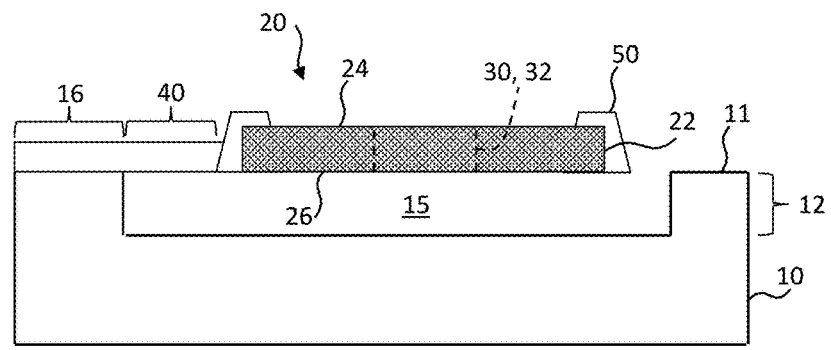
FIG. 2A is a schematic cross section of a micro-device on the source wafer after etching taken across cross-section line A of FIG. 1A according to illustrative embodiments of the present disclosure.
Figure 2B:
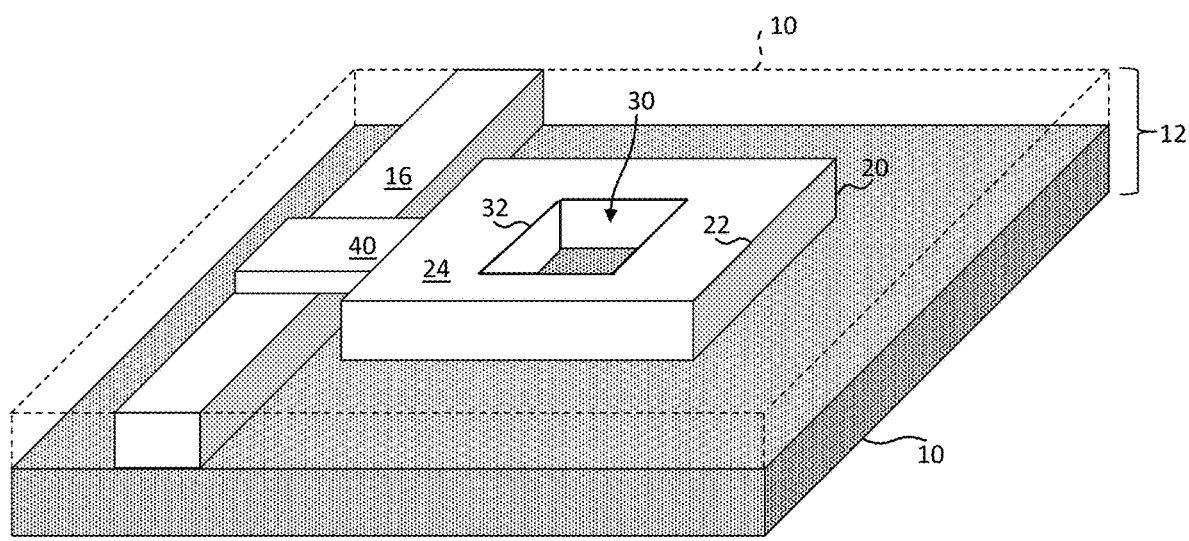
FIG. 2B is a schematic cut-away perspective of a micro-device on the source wafer corresponding to FIG. 2A according to illustrative embodiments of the present disclosure.

According to some embodiments of the present disclosure and as illustrated in FIGS. 1A-1D, etch hole 30 can be rectangular, can have an etch-hole edge 32, can have an etch-hole width $W_E$, or any combination of these. Etch hole 30 can have tapered side walls so that a top side (top opening) of etch hole 30 has a greater area than a bottom side (bottom opening) of etch hole 30 adjacent to source substrate 10. Tether 40 can have a tether width $W_T$ extending along a side of micro-device 20 and connecting micro-device 20 to anchor portion 16. Etch-hole width $W_E$ can be greater than or no less than tether width $W_T$. By providing etch-hole width $W_E$ greater than or no less than tether width $W_T$, sacrificial portion 14 is more readily etched with an etchant beneath micro-device 20 so that micro-device 20 and tether 40 are undercut before the etchant significantly damages anchor portion 16, micro-device 20, or both, as shown in the cross section of FIG. 2A and perspective of FIG. 2B. According to some embodiments of the present disclosure and as illustrated in FIGS. 2A-2B, sacrificial portion 14 becomes a gap 15 (e.g., a cavity) formed by etching (e.g., wet etching or dry etching) or otherwise removing the material comprising sacrificial portion 14, so that micro-device 20 is suspended over source substrate 10 and is physically attached to source substrate 10 only by tether 40 connected to anchor portion 16 of source substrate 10. Micro-device 20 can then be micro-transfer printed (e.g., with an elastomeric stamp) from source substrate 10 to a target substrate 60, as illustrated in FIG. 4, discussed subsequently.

Where etch hole 30 and micro-device 20 are both substantially rectangular, etch hole 30 has an etch-hole edge 32, and micro-device 20 has a micro-device edge 22, etch-hole edge 32 can be substantially parallel to micro-device edge 22 (as shown in FIGS. 1A-2B). Etch hole 30 can have an etch-hole edge 32 with an etch-hole width $W_E$ in the range of 5 microns to 20 microns. According to some embodiments, micro-device 20 has a micro-device edge 22 in the range of 10 microns to 5 mm. For example, micro-device 20 can have a micro-device length $L_M$ no greater than 5 mm, 2 mm, 1 mm, 500 microns, 200 microns, 150 microns, or 100 microns.

Figure 3A:
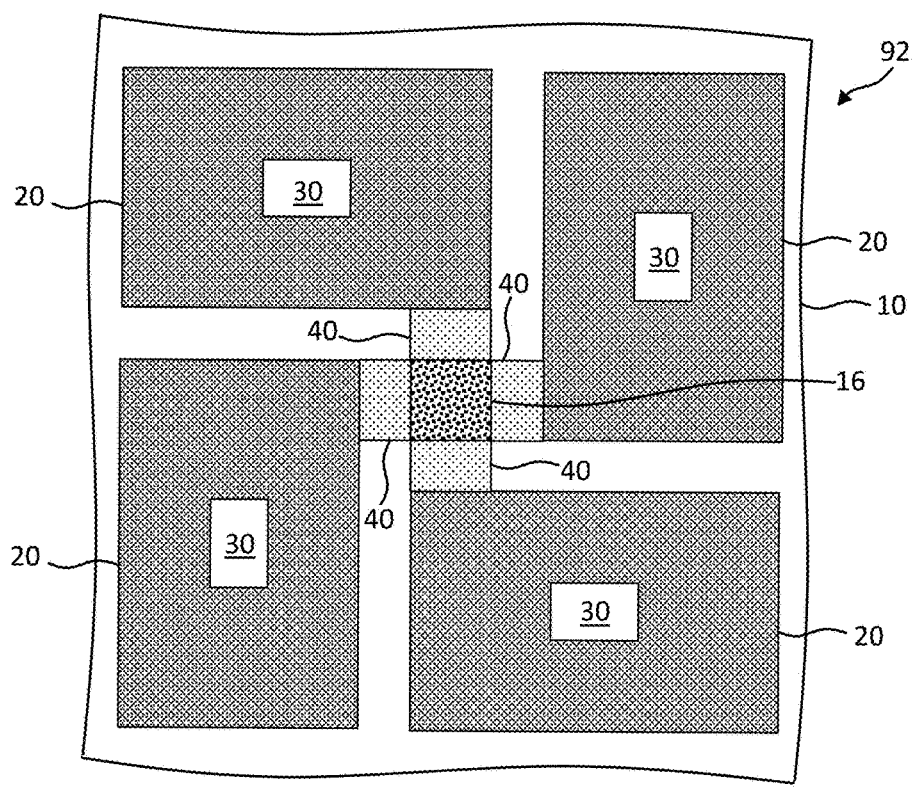
FIG. 3A is a schematic plan view of micro-devices on a source substrate according to illustrative embodiments of the present disclosure.
Figure 3B:
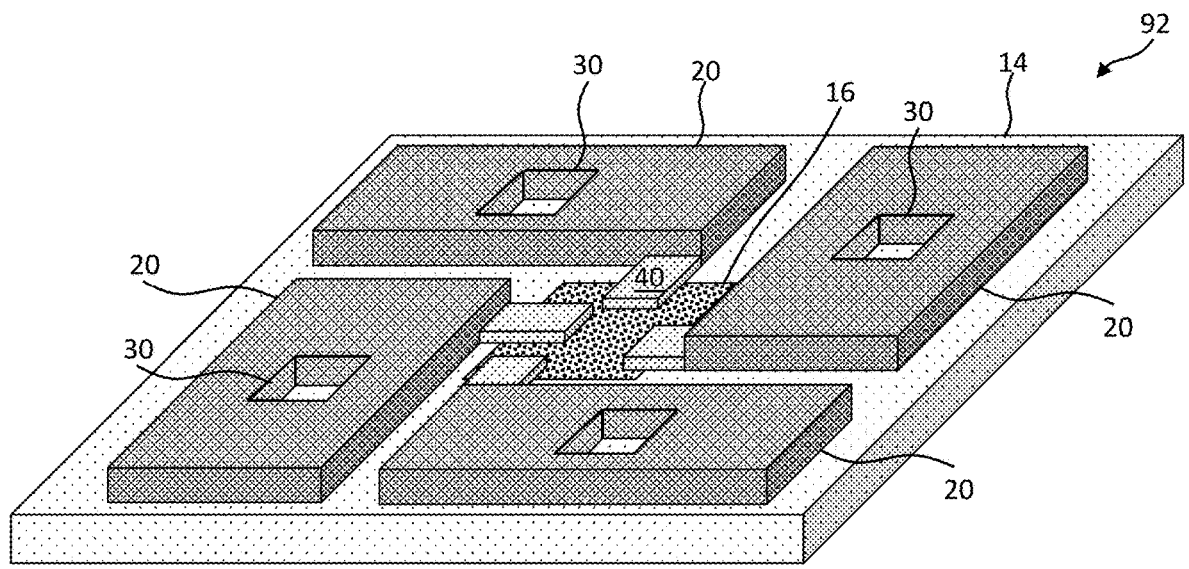
FIG. 3B is a perspective of a micro-device on a source substrate corresponding to FIG. 3A according to illustrative embodiments of the present disclosure.

Embodiments of the present disclosure can enable an efficient use of source substrate 10 area, reducing micro-device 20 manufacturing costs. According to some embodiments and as illustrated in the plan view of FIG. 3A and partial perspective of FIG. 3B, anchor portion 16 can be a central portion to which is physically attached multiple tethers 40 physically connecting corresponding micro-devices 20 with etch holes 30 over sacrificial portions 14. Each micro-device 20 and corresponding tether 40 physically connecting micro-device 20 to anchor portion 16 is a unit that is rotated with respect to all other units physically connected with tethers 40 to the same, common anchor portion 16. Since such a configuration and source substrate 10 layout can have smaller anchor portions 16, the arrangement illustrated in FIG. 3A can more efficiently use the area of source substrate 10, reducing manufacturing costs. That is, more of the area of source substrate 10 is devoted to micro-devices 20. Etch holes 30 enable a faster and more efficient release of micro-devices 20 in the configuration illustrated in FIGS. 3A and 3B from source substrate 10 for sacrificial portions 14 comprising an anisotropically etchable material, such as silicon {100}. Thus, according to embodiments of the present disclosure, a micro-device structure 92 comprises a source substrate 10 having a sacrificial layer 12 comprising sacrificial portions 14 adjacent to an anchor portion 16, micro-devices 20 disposed completely over each sacrificial portion 14, and a tether 40 that physically connects each micro-device 20 to anchor portion 16. Each micro-device 20 and corresponding physically connected tether 40 are rotated with respect to each other micro-device 20 and corresponding physically connected tether 40. In some embodiments, three micro-devices 20 are each physically connected to a common anchor portion 16 with a different tether 40. In some embodiments and as shown in FIGS. 3A and 3B, four micro-devices 20 are each physically connected to a common anchor portion 16 with a different tether 40 and are each rotated by 90 degrees from a neighboring micro-device 20. In some embodiments, micro-devices 20 and corresponding tether 40 are reflections of other micro-devices 20 and tether 40 (not shown in the Figures). In some embodiments, micro-devices 20 are square (e.g., have an aspect ratio of 1:1) and are not reflected or rotated but are physically connected by tethers 40 at different corners of micro-device 20 to anchor portion 60. As used in this context, at different corners also includes configurations in which tether 40 is physically connected to micro-device 20 closer to a corner of micro-device 20 than to a center or to another corner along the same edge of micro-device 20. Physically connecting tethers 40 to micro-devices 20 at the corners of micro-devices 20 as shown in FIGS. 3A and 3B can provide a denser configuration and better utilization of source substrate 10 surface area, but embodiments of the present disclosure are not limited to such configurations.

Figure 4:
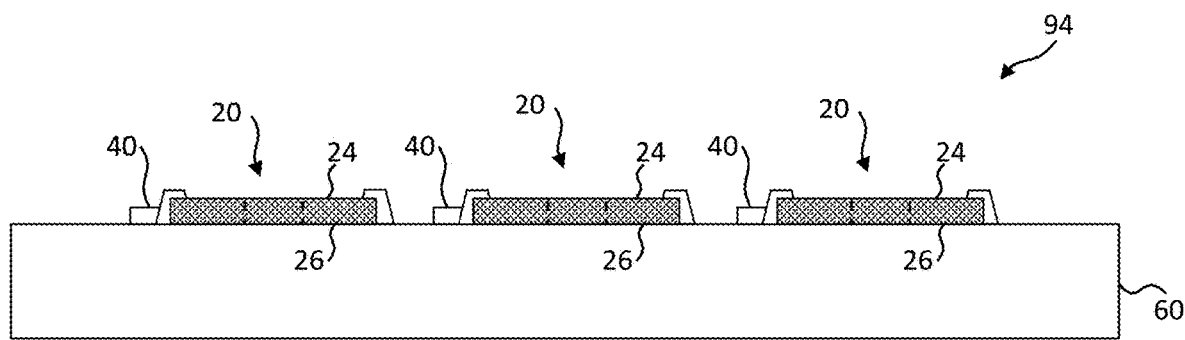
FIG. 4 is a cross section of micro-devices on a target substrate corresponding according to illustrative embodiments of the present disclosure.

According to some embodiments and as shown in FIG. 4, a micro-device structure 94 (e.g., a micro-transfer printed micro-device structure 92) comprises a target substrate 60 and a micro-device 20 (or multiple micro-devices 20) disposed on or over target substrate 60. Micro-device 20 can have a top side 24 and a bottom side 26 opposite top side 24. Bottom side 26 can be adjacent to target substrate 60 and top side 24 is on a side of micro-device 20 opposite target substrate 60. Each micro-device 20 can comprise an etch hole 30 that extends through micro-device 20 from top side 24 to bottom side 26. Etch hole 30 can expose target substrate 60 or a layer on target substrate 60 (e.g., an adhesive layer). Etch hole 30 can have tapered side walls so that a top side (top opening) of etch hole 30 has a greater area than a bottom side (bottom opening) of etch hole 30 adjacent to target substrate 60. A broken (e.g., fractured) or separated tether 40 can be physically connected to micro-device 20, for example as a consequence of micro-transfer printing micro-device 20 from source substrate 10 to target substrate 60. Etch hole 30 can have an etch-hole edge 32 with an etch-hole width $W_E$ in the range of 5 microns to 20 microns. Micro-device 20 can have a micro-device length $L_M$ no greater than 5 mm, 2 mm, 1 mm, 500 microns, 200 microns, 150 microns, or 100 microns. Micro-devices 20 on or over target substrate 60 can be coated with or encapsulated by, an encapsulating layer, for example a resin, planarizing material, silicon dioxide, or silicon nitride.

Figure 5:
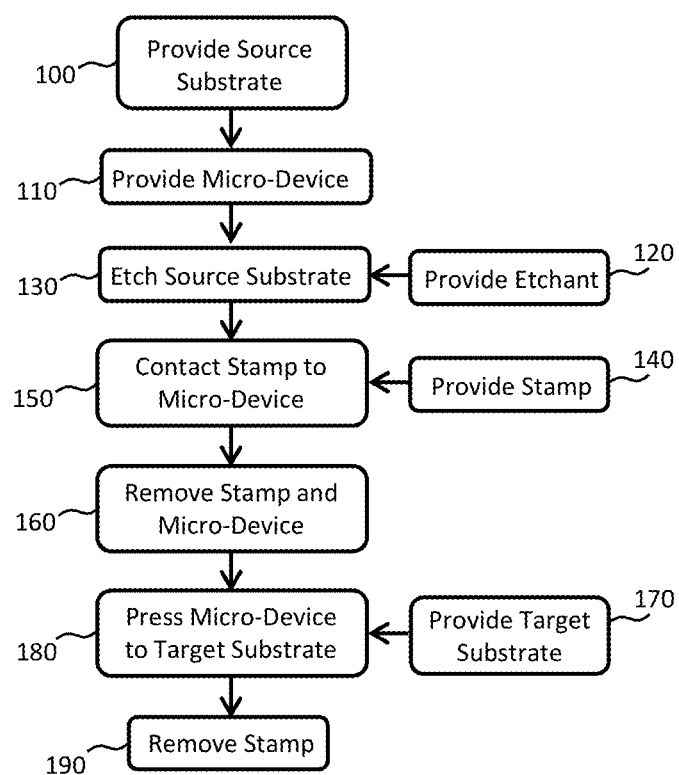
FIG. 5 is a flow diagram according to illustrative embodiments of the present disclosure.

According to some embodiments and as illustrated in the flow diagram of FIG. 5, a method of making a micro-device structure 90 comprises providing a source substrate 10 comprising a sacrificial layer 12 comprising a sacrificial portion 14 adjacent to an anchor portion 16 in step 100 and providing a micro-device 20 disposed completely over sacrificial portion 14 in step 110. Micro-device 20 can have a top side 24 opposite sacrificial layer 12 (or sacrificial portion 14) and a bottom side 26 adjacent to sacrificial layer 12 (or sacrificial portion 14) and can comprise etch hole 30 that extends through micro-device 20 from top side 24 to bottom side 26, exposing a portion of sacrificial portion 14. Tether 40 physically connects micro-device 20 to anchor portion 16. An etchant is provided in step 120, and sacrificial portion 14 is etched in step 130. At least the portion of sacrificial portion 14 exposed by etch hole 30 is etched by the etchant passing through etch hole 30, thereby forming gap 15 between micro-device 20 and source substrate 10, suspending micro-device 20 over source substrate 10, and forming a micro-device structure 90 as shown in FIGS. 2A and 2B. By forming gap 15 and suspending micro-device 20 over source substrate 10, micro-device 20 is rendered micro-transfer printable from source substrate 10. By etching through etch hole 30, sacrificial portion 14 material directly beneath micro-device 20 is etched and, accelerates removal of sacrificial portion 14 material (e.g., where slow-etching crystal planes of an anisotropic source substrate 10 (and sacrificial portion 14) are exposed) and reduces any damage to micro-device 20, tether 40, and anchor portion 16.

According to some embodiments and as illustrated in FIG. 4 and with reference further to FIG. 5, methods of the present disclosure can further comprise providing a stamp in step 140 and target substrate 60 in step 170, contacting micro-device 20 with the stamp to adhere micro-device 20 to the stamp in step 150, removing the stamp from source substrate 10 in step 160, thereby breaking (e.g., fracturing) or separating tether 40, pressing micro-device 20 to target substrate 60 in step 180 to adhere micro-device 20 to target substrate 60, and removing the stamp in step 190, forming a micro-device structure 92 as shown in FIG. 4.

In some embodiments of methods of the present disclosure, sacrificial portions 14 can be etched via wet etch, for example when exposed to a hot bath of tetramethylammonium hydroxide (TMAH) or potassium hydroxide (KOH) or any appropriate chemistry or a gaseous etch.

Figure 6:
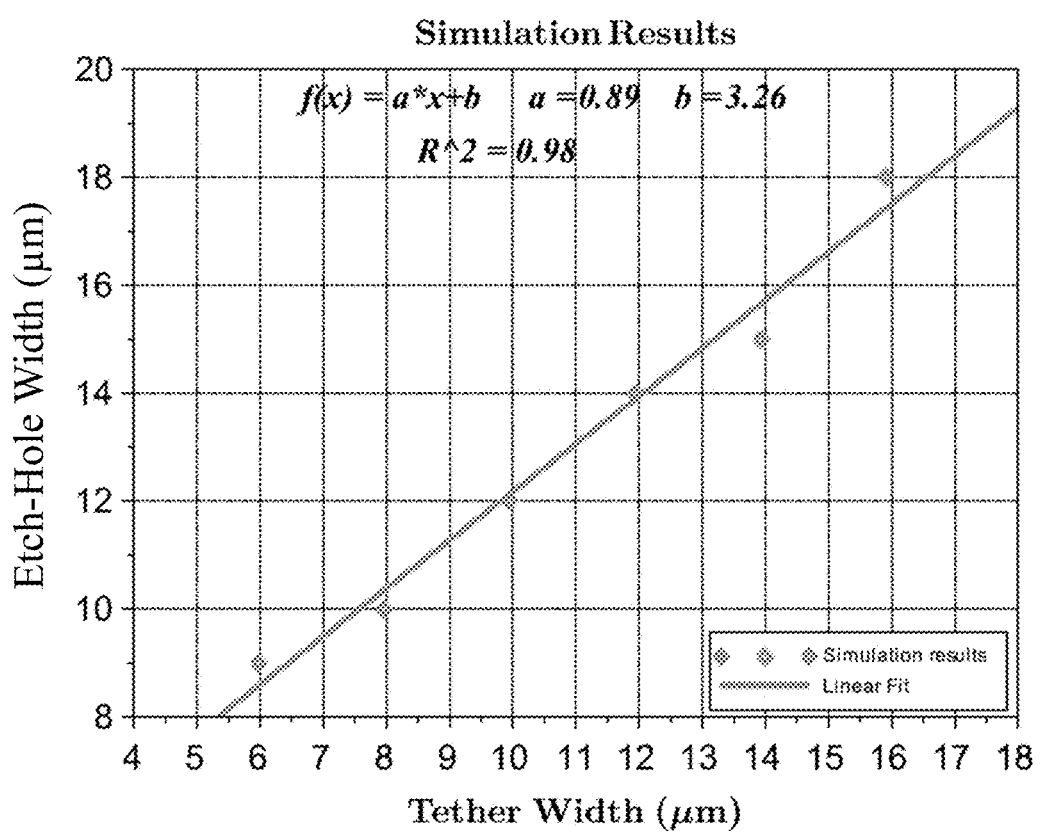
FIG. 6 is a graph illustrating release simulation results for various tether widths and etch-hole widths according to illustrative embodiments of the present disclosure.

Embodiments of the present disclosure have been modeled and their etching characteristics analyzed for tether widths $W_T$ varying from 6 to 16 microns, etch-hole width $W_E$ varying from 9-18 microns with various aspect ratios, anchor portion 16 having a polygonal cross section and diameters of 30-80 microns, and micro-devices 20 having micro-device lengths $L_M$ of 150 microns at various angles of micro-device edge 22 to source substrate flat 18 ranging from 0 to 90 degrees (e.g., including 0 degrees, 22.5 degrees, 45 degrees, 67.5 degrees, and 90 degrees). As shown in the graph of FIG. 6, etch holes 30 with an etch-hole width $W_E$ that is greater than a tether width $W_T$ of a tether 40 successfully release in an acceptable time period. The points graphed in FIG. 6 represent a simulated examples of embodiments that have a particular etch-hole width $W_E$ and tether width $W_T$ that were simulated to release in a single, same acceptable release time, each point representing a different combination of tether width $W_T$ and etch-hole width $W_E$. For example, a tether width $W_T$ of 8 µm and an etch-hole width $W_E$ of 10 µm can be used to release a micro-device 20 in an acceptable release time. Likewise, a tether width $W_T$ of 10 µm and an etch-hole width $W_E$ of 12 µm can be used to release a micro-device 20 in the same acceptable release time, as can a tether width $W_T$ of 12 µm and an etch-hole width $W_E$ of 14 µm. As can be seen from the simulated data plotted in FIG. 6, micro-device 20 can be released (e.g., to be micro-transfer printed) by etching for the chosen preferable acceptable release time when etch-hole width $W_E$ is greater than tether width $W_T$. In some embodiments, less desirable etch times are required for different combinations of tether widths $W_T$ and etch-hole widths $W_E$. An acceptable release time can be chosen based on, for example, commercial considerations (e.g., throughput) and/or a desired extent of release of (e.g., amount of etching under) micro-device 20 to be made (e.g., based on operational parameters of a subsequent micro-transfer printing to be performed).

Figure 7:
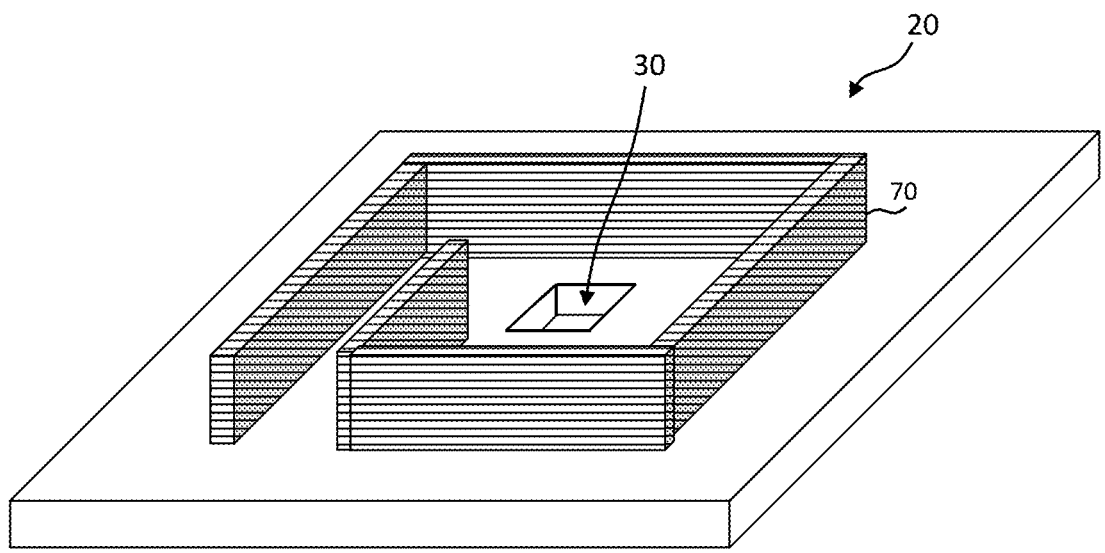
FIG. 7 is a perspective of an antenna micro-device according to illustrative embodiments of the present disclosure.
Figure 8:
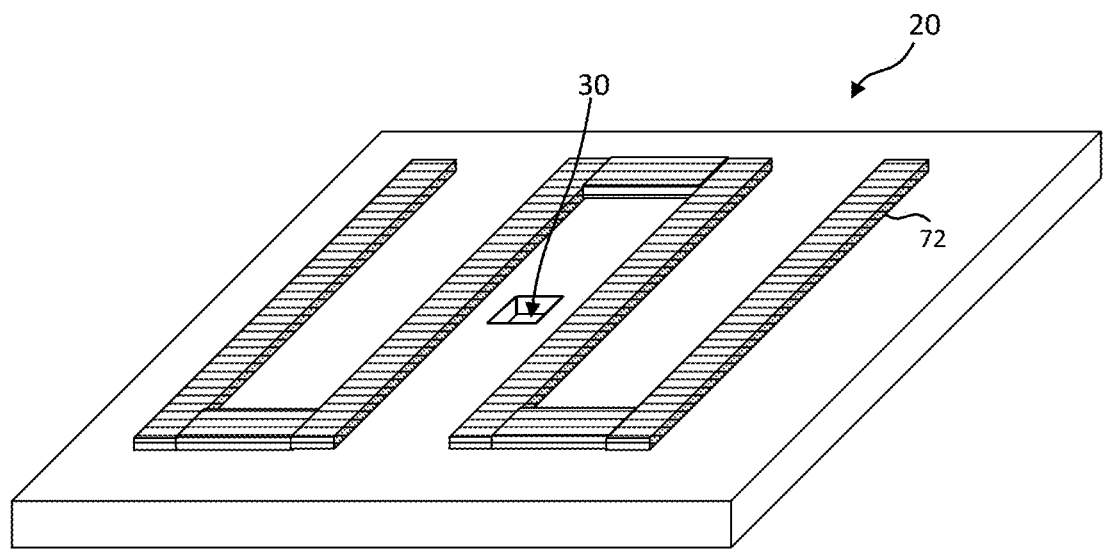
FIG. 8 is a perspective of a micro-heater micro-device according to illustrative embodiments of the present disclosure.
Figure 9:
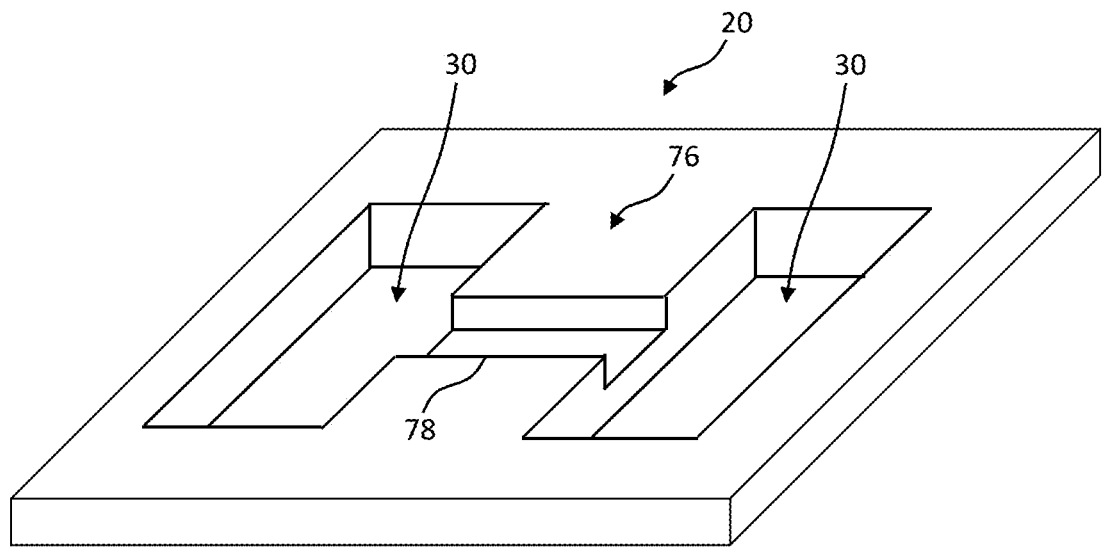
FIG. 9 is a perspective of a micro-fluidic reservoir structure micro-device according to illustrative embodiments of the present disclosure.
Figure 10:
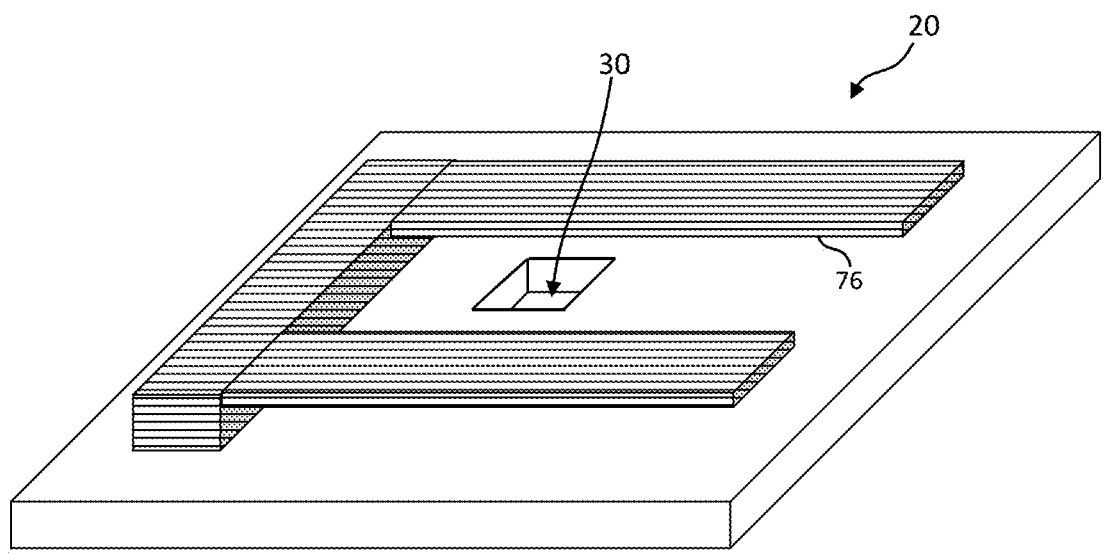
FIG. 10 is a perspective of a piezo-electric power micro-device according to illustrative embodiments of the present disclosure.

Micro-device 20 can be or can include, for example, any one or more of an electronic component, a piezoelectric device, an integrated circuit, an electromechanical filter, an acoustic resonator, an antenna, a micro-heater, a micro-fluidic structure for containing and constraining fluids, a micro-mechanical device, and a power source, for example a piezo-electric power source. In some embodiments of the present disclosure and as illustrated in FIG. 7, micro-device 20 is or comprises an antenna 70. Antenna 70 can be disposed around a periphery of micro-device 20 and can be a spiral antenna, can have a height greater than a width over a surface or substrate of micro-device 20. In some embodiments of the present disclosure and as illustrated in FIG. 8, micro-device 20 is or comprises a micro-heater 72, for example a strip micro-heater 72 comprising a resistive electrical conductor. In some embodiments of the present disclosure and as illustrated in FIG. 9, micro-device 20 is or comprises a micro- or nano-fluidic structure 74, for example comprising one or more etch holes 30 and one or more channels 78 for containing liquids that can flow or wick between etch holes 30 through channel(s) 78. A micro- or nano-fluidic structure 74 can further include one or more pumps, valves, or other fluid control elements. A micro- or nano-fluidic structure 74 can be an open surface structure or be enclosed. Etch holes 30 can act as an inlet or outlet for a micro- or nano-fluidic structure in addition to facilitating etching of sacrificial portion 14 material during micro-device 20 release. In some embodiments of the present disclosure and as illustrated in FIG. 10, micro-device 20 is or comprises a power device 76, for example a piezo-electric device with one or more beams (or cantilevers) that vibrate in response to mechanical stimulation and generate electrical power. More generally, embodiments of the present disclosure can be applied to micro-devices 20 that have space for etch hole 30, for example due to their size, shape, or layout.

Figure 11A:
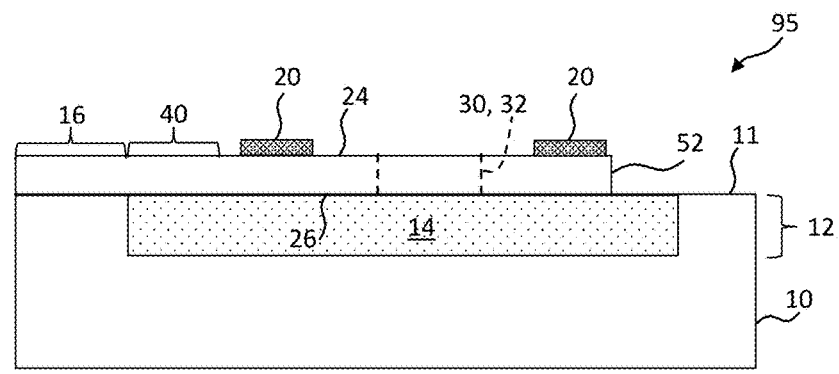
FIGS. 11A-B are a schematic cross section and perspective view, respectively, of an intermediate structure wafer according to illustrative embodiments of the present disclosure.
Figure 11B:
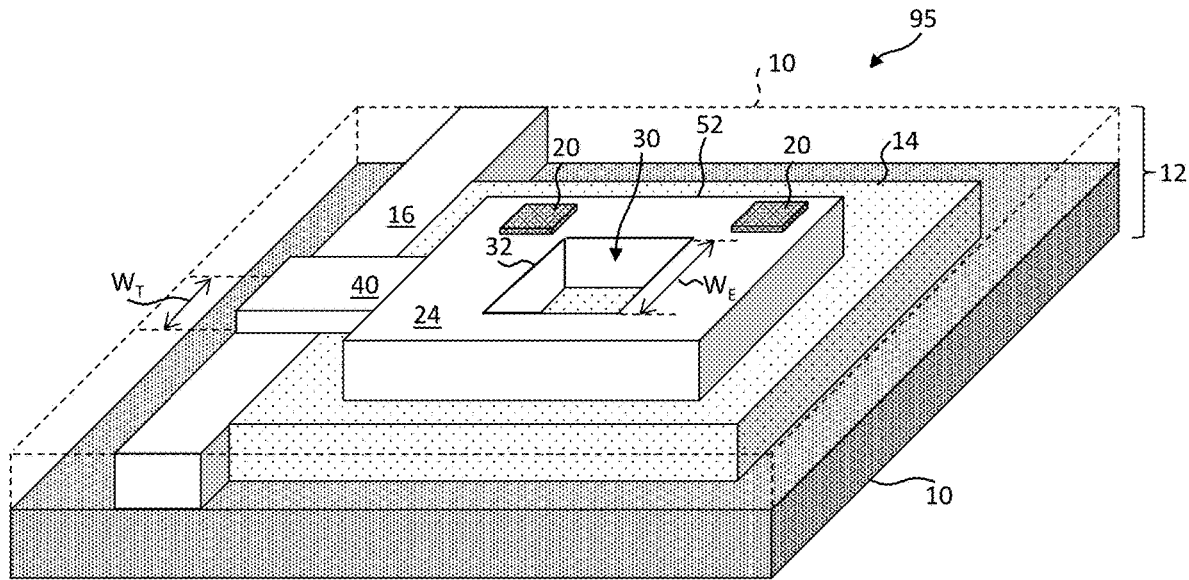

In some embodiments and as illustrated in FIGS. 11A-B, source substrate 10 is an intermediate structure 95 wafer. Source substrate 10 has sacrificial layer 12 comprising sacrificial portion 14. Intermediate substrate 52 is disposed completely over sacrificial portion 14. Intermediate substrate 52 has an etch hole 30 extending through intermediate substrate 52 from top side 24 to bottom side 26. One or more micro-devices 20 are disposed on intermediate substrate 52, for example on top side 24 thereof as shown. Micro-device(s) 20 can be non-native to intermediate substrate 52. Micro-device(s) 20 can be electronic, optical, or optoelectronic devices that can be electrically, optically, or both electrically and optically interconnected on intermediate substrate 52 (e.g., by wire(s) or trace(s) or light pipe(s)). One of micro-device(s) 20 can itself include an etch hole 30 that is disposed in alignment with etch hole 30 of intermediate substrate 52 such that etchant can flow through both. Given that intermediate substrate 52 is relatively large (e.g., at least 2×, at least 4×, or at least 10× larger than micro-device 20), etch hole 30 can assist in promoting fast and complete release of intermediate structure 95 from source substrate 10 such that intermediate structure 95 can be printed to target substrate 60. Intermediate structure 95 is connected to anchor portion 16 with tether 40 to maintain orientation and alignment of intermediate structure 95 after release. Tether 40 can be broken or separated to print intermediate structure 95. Methods of forming intermediate structures 95 that can be readily adapted to include etch holes 30 in intermediate substrates 52 are disclosed in U.S. Pat. No. 10,468,398, the disclosure of which is hereby incorporated by reference.

Although many figures presented herein often illustrate a single micro-device or intermediate substrate in a wafer for simplicity, one of ordinary skill in the art will appreciate that there will generally be many such micro-devices or such intermediate substrates disposed on a wafer (e.g., in a two-dimensional array).

Etch hole 30 can have an area relative to an area of micro-device 20 that is no greater than 10%, no greater than 5%, no greater than 1%, no greater than 0.5%, or no greater than 0.1%. For example, a micro-device 20 that has a micro-device length $L_M$ and micro-device width $W_M$ of 100 microns each and a square etch hole 30 of 10 microns to a side, will have an etch hole area of 1%. For the simulated micro-device 20 having a micro-device length $L_M$ and micro-device width $W_M$ of 150 microns each and a square etch hole 30 of 10 microns to a side, will have an etch hole area of 0.44%.

Micro-device 20 can be native to source substrate 10, or non-native to source substrate 10. A micro-device 20 can be any device that has at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and, optionally, a thickness of from 200 nm to 200 microns (e.g., at least or no more than 2 microns, 20 microns, or 200 microns). In some embodiments, micro-device 20 has a dimension as large as, or larger than 5 mm. Micro-device 20 can have any suitable aspect ratio or size in any dimension and any useful shape, for example a rectangular cross section.

In some embodiments of the present disclosure, micro-devices 20 are small integrated circuits, which may be referred to as chiplets, having a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns), and (iii) a length of 5-1000 microns (e.g., 5-10 microns, 10-50 microns, 50-100 microns, or 100-1000 microns). Such chiplets can be made in a native source semiconductor wafer (e.g., a silicon wafer) having a process side and a back side used to handle and transport the wafer using lithographic processes. Micro-devices 20 can be formed using lithographic processes in an active layer on or in the process side of source substrate 10. Methods of forming such structures are described, for example, in U.S. Pat. No. 8,889,485. According to some embodiments of the present disclosure, source substrates 10 can be provided with micro-devices 20, sacrificial layer 12 (a release layer), sacrificial portions 14, and tethers 40 already formed, or they can be constructed as part of a process in accordance with certain embodiments of the present disclosure.

In certain embodiments, micro-devices 20 can be constructed using foundry fabrication processes used in the art. Layers of materials can be used, including materials such as metals, oxides, nitrides and other materials used in the integrated-circuit art. Micro-devices 20 can have different sizes, for example, less than 1000 square microns or less than 10,000 square microns, less than 100,000 square microns, or less than 1 square mm, or larger. Micro-devices 20 can have, for example, at least one of a length, a width, and a thickness of no more than 500 microns (e.g., no more than 250 microns, no more than 100 microns, no more than 50 microns, no more than 25 microns, or no more than 10 microns). Micro-devices 20 can have variable aspect ratios, for example at least 1:1, at least 2:1, at least 5:1, or at least 10:1. Micro-devices 20 can be rectangular or can have other shapes.

Tethers 40 can comprise any suitable tether material and can incorporate one or more layers, for example one or more layers similar to or the same as those layer(s) of micro-device 20, for example comprising electrode material, dielectric(s), or encapsulation layer(s), including resins, silicon oxides, silicon nitrides, or semiconductors. Tethers 40 can be constructed be depositing (e.g., by evaporation or sputtering) material such as oxide, nitride, metal, polymer, or semiconductor material, and patterning the material, for example using photolithographic methods and materials, such as pattern-wise exposed and etched photoresist.

Source substrate 10 can be any useful substrate with a surface suitable for forming or having patterned sacrificial layers 12, sacrificial portions 14, anchor portions 16, and forming or disposing micro-devices 20. Source substrate 10 can comprise glass, ceramic, polymer, metal, quartz, or semiconductors, for example as found in the integrated circuit or display industries. Sacrificial portion 14 can be a designated portion of sacrificial layer 12, for example an anisotropically etchable portion, for example designated by virtue of etchant applied to source substrate 10 is exposed to it relative to other portions of source substrate 10, or a differentially etchable material from sacrificial layer 12, for example a buried oxide or nitride layer, such as silicon dioxide. A surface of source substrate 10 surface can be substantially planar and suitable for photolithographic processing, for example as found in the integrated circuit or MEMs art. Source substrate 10 can be chosen, for example, based on desirable growth characteristics (e.g., lattice constant, crystal structure, or crystallographic orientation) for growing one or more materials thereon. In some embodiments of the present disclosure, source substrate 10 is anisotropically etchable. For example, source substrate 10 can be a monocrystalline silicon substrate with a {100} orientation. An anisotropically etchable material etches at different rates in different crystallographic directions, due to reactivities of different crystallographic planes to a given etchant. For example, potassium hydroxide (KOH) displays an etch rate selectivity 400 times higher in silicon [100] crystal directions than in silicon [111] directions. In particular, silicon {100} is a readily available, relatively lower cost monocrystalline silicon material. Moreover, in some embodiments, micro-devices 20 made on or in a silicon {100} crystal structure can have less stress and therefore less device bowing after release.

The present disclosure provides, inter alia, a structure and method for improving the release of a micro-transfer-printable micro-device structure 90 from source substrate 10 (source wafer) by etching, in particular where sacrificial layer 12 in source substrate 10 comprises an anisotropically etchable crystalline semiconductor material such as silicon {100}. Patterned sacrificial layer 12 defines sacrificial portions 14 comprising a sacrificial material laterally spaced apart by anchor portions 16. Anchor portions 16 can be a non-sacrificial portion of sacrificial layer 12, can be disposed over sacrificial layer 12, or both. Anchor portions 16 can comprise a non-sacrificial portion of sacrificial layer 12 and, optionally, material deposited on sacrificial layer 12, for example the same material deposited to form micro-devices 20 in a common step or an encapsulating material in a common deposition step. A micro-device 20 is disposed entirely and completely over each sacrificial portion 14 and is physically connected to anchor portion 16 by tether 40. An encapsulation layer comprising an encapsulation material can encapsulate any one or combination of micro-devices 20, tether 40, and anchor portion 16. In some embodiments, an encapsulation layer forms tether 40 or a portion of tether 40 so that tether 40 comprises the encapsulation layer or the encapsulation material. In some embodiments, the encapsulation layer forms anchor portion 16 or a portion of anchor portion 16.

According to some embodiments of the present disclosure, etch hole 30 is disposed in micro-device 20 and extends through micro-device 20. Etch hole 30 can be a hole, for example a shaped hole. Etch holes 30 can be formed by pattern-wise etching micro-device 20, for example using deposited (e.g., by spin or curtain coating) patterned photoresists such as are found in the integrated circuit arts. Once etch hole 30 is present in micro-device 20, an etchant, for example a liquid etchant, can be disposed over micro-device 20 and tether 40 on a side of over micro-device 20 and tether 40 opposite sacrificial portion 14 and pass through etch hole 30 to contact and etch sacrificial portion 14. Etch hole 30 can have various shapes and is necessarily smaller than micro-device 20. In some embodiments, etch hole 30 has a shape approximately similar or geometrically similar (e.g., having the same relative proportions) as micro-device 20.

In some embodiments, etchants can also be applied to sacrificial portion 14 around a perimeter of micro-devices 20 and tethers 40 to release micro-devices 20 from source substrate 10 (in addition to through etch holes 30). In some embodiments of a micro-transfer printing materials system, anisotropically etchable sacrificial portions 14 take a longer time to etch and release micro-devices 20 than is desired, leading to etching damage to micro-devices 20 and tethers 40 and reducing manufacturing throughput. These issues are addressed, according to embodiments of the present disclosure, by providing etch hole 30 in micro-device 20. Etch hole 30 provides access to etchants and can have convex angles that enable fast and efficient etching beneath micro-device 20 and, optionally tether 40. Sacrificial portion 14 etchants pass through etch hole 30 to attack sacrificial portion 14 beneath micro-device 20 at convex corners, decreasing the time necessary to fully release micro-device 20 and tether 40 from source substrate 10 and prepare micro-device 20 for micro-transfer printing with a stamp.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
B cross section line
D direction
$W_T$ tether width
$W_M$ micro-device width
$W_E$ etch-hole width
$L_M$ micro-device length
10 source substrate/source wafer
11 source substrate surface
12 sacrificial layer
14 sacrificial portion
15 gap
16 anchor portion
18 source substrate flat
20 micro-device
22 micro-device edge
24 top side
26 bottom side
30 etch hole
32 etch-hole edge
40 tether
50 dielectric structures
52 intermediate substrate
60 target substrate
70 antenna
72 micro-heater
74 micro-fluidic structure/nano-fluidic structure 76 power device
78 channel
90 micro-device structure
92 micro-device structure
94 micro-device structure
95 intermediate structure
100 provide source substrate step
110 provide micro-device step
120 provide etchant step
130 etch source substrate step
140 provide stamp step
150 contact stamp to micro-device step
160 remove stamp and micro-device step
170 provide target substrate step
180 press micro-device to target substrate with stamp step
190 remove stamp step

The invention claimed is:

1. A micro-device structure, comprising:
a source substrate having a sacrificial layer comprising a sacrificial portion adjacent to an anchor portion; and
a micro-device comprising a micro-device substrate, disposed completely and exclusively over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and
a tether that physically connects the micro-device to the anchor portion,
wherein the etch hole is in contact with the sacrificial portion and exposes at least a portion of the sacrificial portion.

2. The micro-device structure of claim 1, wherein the sacrificial portion has a crystalline structure that is anisotropically etchable.

3. The micro-device structure of claim 1, wherein the source substrate is made of silicon {100}.

4. The micro-device structure of claim 1, wherein the source substrate has a crystalline structure with a {100} orientation and the bottom side of the micro-device is substantially parallel to a {100} crystal plane at a surface of the source substrate.

5. The micro-device structure of claim 1, wherein the tether physically connects the anchor portion directly to a corner of the micro-device or directly to a portion of the micro-device closer to the corner than to a center or opposite corner along an edge of the micro-device.

6. The micro-device structure of claim 1, wherein the micro-device comprises an antenna disposed on the micro-device substrate.

7. A micro-device structure, comprising:
a source substrate having a sacrificial layer comprising a sacrificial portion adjacent to an anchor portion; and
a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and
a tether that physically connects the micro-device to the anchor portion,
wherein the etch hole is in contact with the sacrificial portion and exposes at least a portion of the sacrificial portion, and
wherein the hole is at a geometric center of the micro-device.

8. A micro-device structure, comprising:
a source substrate having a sacrificial layer comprising a sacrificial portion adjacent to an anchor portion; and
a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and
a tether that physically connects the micro-device to the anchor portion,
wherein the etch hole is in contact with the sacrificial portion and exposes at least a portion of the sacrificial portion,
wherein the source substrate has a crystalline structure with a {100} orientation and the bottom side of the micro-device is substantially parallel to a {100} crystal plane at a surface of the source substrate, and
wherein the micro-device has a micro-device edge direction oriented at an angle from 30 to 60 degrees with respect to a {110} crystal plane of the crystalline structure.

9. The micro-device structure of claim 8, wherein the micro-device comprises a micro-device edge having a direction oriented at an angle of substantially 45 degrees with respect to the {110} crystal plane.

10. A micro-device structure, comprising:
a source substrate having a sacrificial layer comprising a sacrificial portion adjacent to an anchor portion; and
a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and
a tether that physically connects the micro-device to the anchor portion,
wherein the etch hole is in contact with the sacrificial portion and exposes at least a portion of the sacrificial portion,
wherein the source substrate has a crystalline structure with a {100} crystal plane, the micro-device has a micro-device length greater than a micro-device width and the micro-device length is in a direction that is substantially parallel to the {100} crystal plane,
wherein the source substrate has a crystalline structure with a {100} crystal plane, the micro-device has a micro-device length greater than a micro-device width and the micro-device length is in a direction that is substantially parallel to the {100} crystal plane.

11. A micro-device structure, comprising:
a source substrate having a sacrificial layer comprising a sacrificial portion adjacent to an anchor portion; and
a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and a tether that physically connects the micro-device to the anchor portion, wherein the etch hole is in contact with the sacrificial portion and exposes at least a portion of the sacrificial portion, wherein the etch hole is rectangular and has an etch-hole width, the tether has a tether width connecting the micro-device to the anchor portion, and the etch-hole width is no less than the tether width.

12. The micro-device structure of claim 11, wherein the etch-hole width is measured in a direction parallel to the tether width.

13. A micro-device structure, comprising:

a source substrate having a sacrificial layer comprising a sacrificial portion adjacent to an anchor portion; and a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and a tether that physically connects the micro-device to the anchor portion, wherein the etch hole is in contact with the sacrificial portion and exposes at least a portion of the sacrificial portion, wherein the etch hole and the micro-device are both rectangular, the etch hole has an etch-hole edge, the micro-device has a micro-device edge, and the etch-hole edge is substantially parallel to the micro-device edge.

14. A micro-device structure, comprising:

a source substrate having a sacrificial layer comprising a sacrificial portion adjacent to an anchor portion; and micro-devices, each comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side, and each of the micro-devices physically connected by a respective tether to the anchor portion, wherein each of the micro-devices and the respective tether are rotated or reflected with respect to any other of the micro-devices and the respective tether, wherein the etch holes are in contact with the sacrificial portion and expose at least a portion of the sacrificial portion.

15. A micro-device structure, comprising:

a source substrate having a sacrificial layer comprising a sacrificial portion adjacent to an anchor portion; and a micro-device, comprising a micro-device substrate, disposed completely over the sacrificial portion, the micro-device substrate having a top side opposite the sacrificial portion and a bottom side adjacent to the sacrificial portion and comprising an etch hole that extends entirely through an interior portion of the micro-device substrate from the top side to the bottom side; and a tether that physically connects the micro-device to the anchor portion, wherein the etch hole is in contact with the sacrificial portion and exposes at least a portion of the sacrificial portion, wherein the micro-device comprises an antenna disposed on the micro-device substrate around the etch hole.

* * * * *